United States Patent
Davis et al.

(10) Patent No.: US 11,023,341 B2
(45) Date of Patent: Jun. 1, 2021

(54) INJECTION OF SIMULATED HARDWARE FAILURE(S) IN A FILE SYSTEM FOR ESTABLISHING FILE SYSTEM TOLERANCE-TO-STORAGE-FAILURE(S)

(71) Applicant: International Business Machines Corporation, Armonk, NY (US)

(72) Inventors: James C. Davis, Blacksburg, VA (US); Willard A. Davis, Rosendale, NY (US)

(73) Assignee: International Business Machines Corporation, Armonk, NY (US)

( * ) Notice: Subject to any disclaimer, the term of this patent is extended or adjusted under 35 U.S.C. 154(b) by 124 days.

(21) Appl. No.: 16/277,886

(22) Filed: Feb. 15, 2019

(65) Prior Publication Data

US 2020/0264961 A1   Aug. 20, 2020

(51) Int. Cl.
   *G06F 11/00*   (2006.01)
   *G06F 11/26*   (2006.01)
   *G06F 11/263*  (2006.01)
   *G06F 30/20*   (2020.01)

(52) U.S. Cl.
   CPC .......... *G06F 11/261* (2013.01); *G06F 11/263* (2013.01); *G06F 30/20* (2020.01)

(58) Field of Classification Search
   CPC ............... G06F 11/263; G06F 11/2635; G06F 11/3676; G06F 11/3688; G06F 11/3692; G06F 11/2653
   USPC ....................................................... 714/1–57
   See application file for complete search history.

(56) References Cited

U.S. PATENT DOCUMENTS

| | | | |
|---|---|---|---|
| 7,467,333 B2 | 12/2008 | Keeton et al. | |
| 7,536,605 B2 | 5/2009 | Keaffaber et al. | |
| 8,843,786 B2 | 9/2014 | Jibbe et al. | |
| 9,389,977 B2 | 7/2016 | Jang et al. | |
| 2008/0155316 A1* | 6/2008 | Pawar ................. | G06F 11/1435 714/6.13 |

(Continued)

FOREIGN PATENT DOCUMENTS

WO   2016209713 A1   12/2016

OTHER PUBLICATIONS

Gatla et al., "Understanding the Fault Resilience of File System Checkers," USENIX, HotStorage 2017, 8 pages, retrieved from https://www.usenix.org/system/files/conference/hotstorage17/hotstorage17-paper-gatla.pdf.

(Continued)

*Primary Examiner* — Sarai E Butler
(74) *Attorney, Agent, or Firm* — Zilka-Kotab, P.C.

(57) ABSTRACT

A computer-implemented method according to one embodiment includes determining a location within a file system that is potentially vulnerable to hardware failures, and injecting one or more simulated hardware failures into the determined location within the file system. The method further includes determining whether the file system was damaged as a result of injecting the simulated hardware failure(s). In response to determining that the injection of the simulated hardware failure(s) resulted in damage to the file system, it is determined whether the damage is repairable. Based on whether the file system was damaged as a result of injecting the simulated hardware failure(s) and/or based on whether or not the damage is determined to be repairable, a tolerance-to-storage-failure score is assigned to the file system.

20 Claims, 6 Drawing Sheets

(56) References Cited

U.S. PATENT DOCUMENTS

| | | | |
|---|---|---|---|
| 2013/0159791 A1* | 6/2013 | Marinet | G06F 11/073 714/48 |
| 2013/0275815 A1* | 10/2013 | De Keyser | G06F 3/064 714/47.2 |
| 2014/0108339 A1* | 4/2014 | Marsden | G06F 16/273 707/611 |
| 2014/0298082 A1* | 10/2014 | Rikitake | G06F 11/2215 714/4.11 |
| 2015/0121165 A1* | 4/2015 | Lam | G06F 3/0685 714/758 |
| 2016/0118137 A1* | 4/2016 | Zhang | G06F 11/1048 365/185.09 |
| 2016/0378625 A1* | 12/2016 | Aizer | G06F 3/065 714/6.3 |
| 2017/0004044 A1* | 1/2017 | Tormasov | G06F 3/0643 |
| 2017/0091129 A1* | 3/2017 | Oberman | G06F 13/4068 |
| 2018/0060202 A1 | 3/2018 | Papak et al. | |
| 2018/0061269 A1* | 3/2018 | Dutta | G09B 9/00 |
| 2018/0089251 A1* | 3/2018 | Romano | G06F 21/105 |
| 2019/0111969 A1* | 4/2019 | Pramod | B62D 5/006 |
| 2019/0220346 A1* | 7/2019 | Vergnes | G11C 29/022 |
| 2020/0142609 A1* | 5/2020 | Meiri | G06F 3/0679 |

OTHER PUBLICATIONS

Wikipedia, "Data degradation," Wikipedia, Dec. 11, 2018, pp. 1-3, retrieved from https://en.wikipedia.org/wiki/Data_degradation.

Carreira et al., "Scalable Testing of File System Checkers," ACM EuroSys Conference on Computer System, Apr. 2012, pp. 1-13.

Wikipedia, "Disk sector," Wikipedia, Nov. 27, 2018, pp. 1-4, retrieved from https://en.wikipedia.org/wiki/Disk_sector.

Wikipedia, "Fault injection," Wikipedia, Sep. 29, 2018, pp. 1-6, retrieved from https://en.wikipedia.org/wiki/Fault_injection.

* cited by examiner

INJECTION OF SIMULATED HARDWARE FAILURE(S) IN A FILE SYSTEM FOR ESTABLISHING FILE SYSTEM TOLERANCE-TO-STORAGE-FAILURE(S)

BACKGROUND

The present invention relates to file systems, and more specifically, this invention relates to injecting one or more simulated hardware failures into a file system for determining a relative degree of tolerance that the file system has for storage failures.

File systems are an integral subsystem underlying conventional computer systems. Such file systems are often stored on hard disks (HDDs) or solid state drives (SSDs). A file system is responsible for maintaining the stability of the contents of user files and directories over time. For example, a user that stores data in a file system anticipates being able to access a most recently saved state of such data files thereafter upon requesting the file.

SUMMARY

A computer-implemented method according to one embodiment includes determining a location within a file system that is potentially vulnerable to hardware failures, and injecting one or more simulated hardware failures into the determined location within the file system. The method further includes determining whether the file system was damaged as a result of injecting the simulated hardware failure(s). In response to determining that the injection of the simulated hardware failure(s) resulted in damage to the file system, it is determined whether the damage is repairable. Based on whether the file system was damaged as a result of injecting the simulated hardware failure(s) and/or based on whether or not the damage is determined to be repairable, a tolerance-to-storage-failure score is assigned to the file system.

A computer program product for utilizing hardware failure simulation for assessing a tolerance of a file system to storage failures according to another embodiment includes a computer readable storage medium having program instructions embodied therewith. The program instructions are readable and/or executable by a computer to cause the computer to perform the foregoing method.

A system according to another embodiment includes a processor, and logic integrated with the processor, executable by the processor, or integrated with and executable by the processor. The logic is configured to perform the foregoing method.

Other aspects and embodiments of the present invention will become apparent from the following detailed description, which, when taken in conjunction with the drawings, illustrate by way of example the principles of the invention.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several preferred embodiments of systems, methods and computer program products for injecting one or more simulated hardware failures into a file system for determining a relative degree of tolerance that the file system has for storage failures.

In one general embodiment, a computer-implemented method includes determining a location within a file system that is potentially vulnerable to hardware failures, and injecting one or more simulated hardware failures into the determined location within the file system. The method further includes determining whether the file system was damaged as a result of injecting the simulated hardware failure(s). In response to determining that the injection of the simulated hardware failure(s) resulted in damage to the file system, it is determined whether the damage is repairable. Based on whether the file system was damaged as a result of injecting the simulated hardware failure(s) and/or based on whether or not the damage is determined to be repairable, a tolerance-to-storage-failure score is assigned to the file system.

In another general embodiment, a computer program product for utilizing hardware failure simulation for assessing a tolerance of a file system to storage failures includes a computer readable storage medium having program instructions embodied therewith. The program instructions are readable and/or executable by a computer to cause the computer to perform the foregoing method.

In another general embodiment, a system includes a processor, and logic integrated with the processor, executable by the processor, or integrated with and executable by the processor. The logic is configured to perform the foregoing method.

Figure 1:
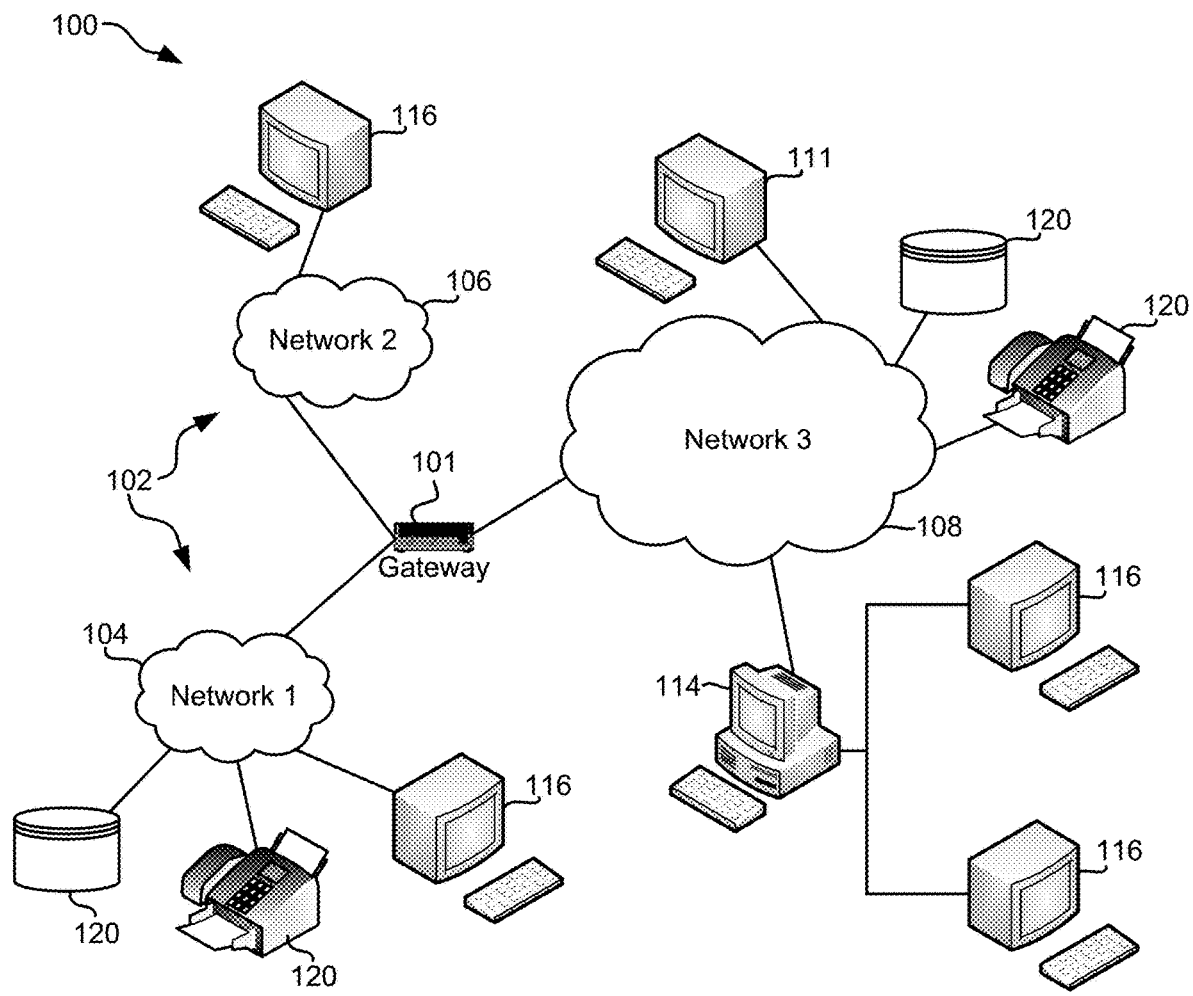
FIG. 1 is a network architecture, in accordance with one embodiment.

FIG. 1 illustrates an architecture 100, in accordance with one embodiment. As shown in FIG. 1, a plurality of remote networks 102 are provided including a first remote network 104 and a second remote network 106. A gateway 101 may be coupled between the remote networks 102 and a proximate network 108. In the context of the present architecture 100, the networks 104, 106 may each take any form including, but not limited to a local area network (LAN), a wide area network (WAN) such as the Internet, public switched telephone network (PSTN), internal telephone network, etc.

In use, the gateway 101 serves as an entrance point from the remote networks 102 to the proximate network 108. As such, the gateway 101 may function as a router, which is capable of directing a given packet of data that arrives at the gateway 101, and a switch, which furnishes the actual path in and out of the gateway 101 for a given packet.

Further included is at least one data server 114 coupled to the proximate network 108, and which is accessible from the remote networks 102 via the gateway 101. It should be noted that the data server(s) 114 may include any type of computing device/groupware. Coupled to each data server 114 is a plurality of user devices 116. User devices 116 may also be connected directly through one of the networks 104, 106, 108. Such user devices 116 may include a desktop computer, lap-top computer, hand-held computer, printer or any other type of logic. It should be noted that a user device 111 may also be directly coupled to any of the networks, in one embodiment.

A peripheral 120 or series of peripherals 120, e.g., facsimile machines, printers, networked and/or local storage units or systems, etc., may be coupled to one or more of the networks 104, 106, 108. It should be noted that databases and/or additional components may be utilized with, or integrated into, any type of network element coupled to the networks 104, 106, 108. In the context of the present description, a network element may refer to any component of a network.

According to some approaches, methods and systems described herein may be implemented with and/or on virtual systems and/or systems which emulate one or more other systems, such as a UNIX system which emulates an IBM z/OS environment, a UNIX system which virtually hosts a MICROSOFT WINDOWS environment, a MICROSOFT WINDOWS system which emulates an IBM z/OS environment, etc. This virtualization and/or emulation may be enhanced through the use of VMWARE software, in some embodiments.

In more approaches, one or more networks 104, 106, 108, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used.

Figure 2:
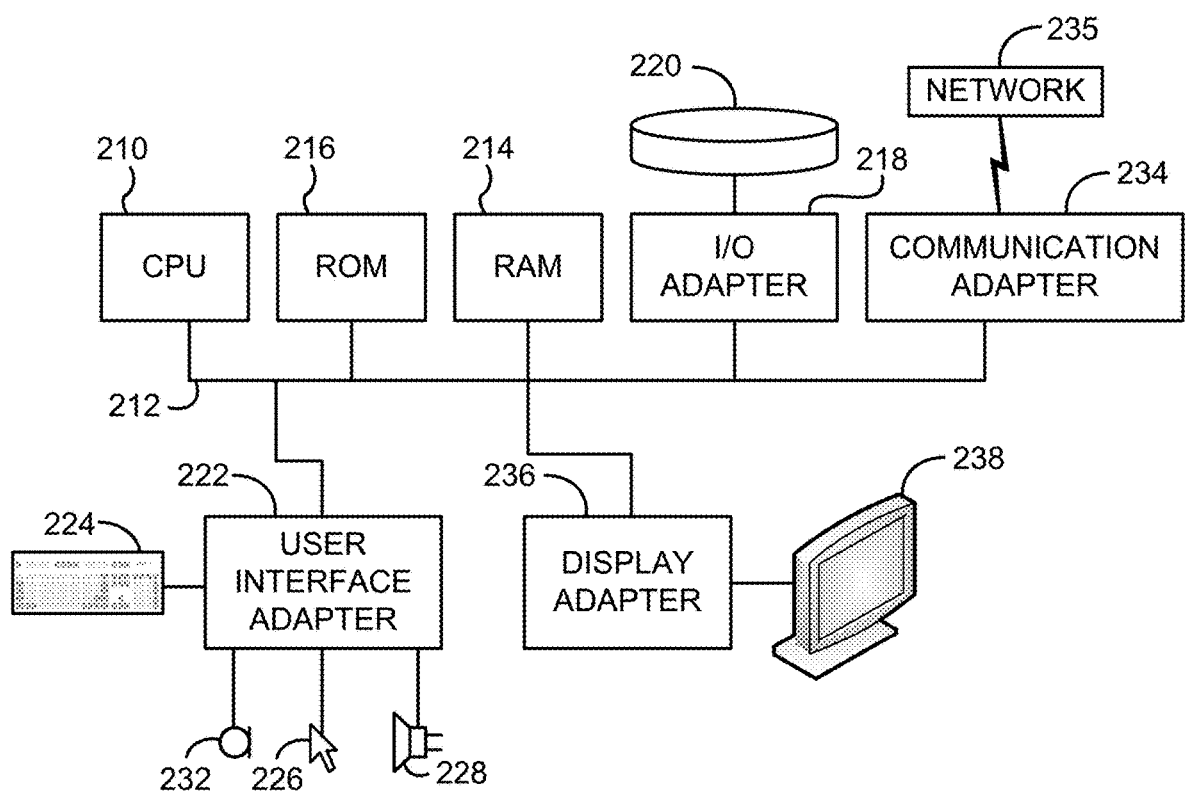
FIG. 2 is a representative hardware environment that may be associated with the servers and/or clients of FIG. 1, in accordance with one embodiment.

FIG. 2 shows a representative hardware environment associated with a user device 116 and/or server 114 of FIG. 1, in accordance with one embodiment. Such figure illustrates a typical hardware configuration of a workstation having a central processing unit 210, such as a microprocessor, and a number of other units interconnected via a system bus 212.

The workstation shown in FIG. 2 includes a Random Access Memory (RAM) 214, Read Only Memory (ROM) 216, an input/output (I/O) adapter 218 for connecting peripheral devices such as disk storage units 220 to the bus 212, a user interface adapter 222 for connecting a keyboard 224, a mouse 226, a speaker 228, a microphone 232, and/or other user interface devices such as a touch screen and a digital camera (not shown) to the bus 212, communication adapter 234 for connecting the workstation to a communication network 235 (e.g., a data processing network) and a display adapter 236 for connecting the bus 212 to a display device 238.

The workstation may have resident thereon an operating system such as the Microsoft Windows® Operating System (OS), a MAC OS, a UNIX OS, etc. It will be appreciated that a preferred embodiment may also be implemented on platforms and operating systems other than those mentioned. A preferred embodiment may be written using eXtensible Markup Language (XML), C, and/or C++ language, or other programming languages, along with an object oriented programming methodology. Object oriented programming (OOP), which has become increasingly used to develop complex applications, may be used.

As previously mentioned elsewhere herein, file systems are an integral subsystem underlying conventional computer systems. Such file systems are often stored on HDDs or SSDs. However, these storage locations are subject to a degradation of data stored therein over time, commonly referred to as "data degradation." An administrator of a file system may have an extensive array of file system options to choose from, including free storage software platforms and paid storage software platforms. File systems may be differentiated according to various dimensions, e.g., such as performance, ease of management, cost, etc. However, not included in a calculus of file systems is a file system's capacity to survive data degradation. This is despite data degradation being a concern of system administrators who are responsible for maintaining user data over years or decades, and moreover, who are responsible for scheduling backups and upgrades to prevent data degradation from rendering a file system useless. Data degradation is furthermore a concern for embedded systems, e.g., in the computers that run a car, for file systems deployed in challenging physical environments such as the International Space Station (ISS) or deep sea exploration. For example, in outer space, data degradation, e.g., such as the flipping of bits, may occur more frequently than in a typical data center context as a result of increased radiation contacting written data stored according to a file system on a data storage device.

In sharp contrast to the conventional systems described elsewhere above, various embodiments and/or approaches described herein consider a file system's capacity to survive data degradation. More specifically, various embodiments and/or approaches described herein include injecting one or more simulated hardware failures into locations of a file system that are determined to be potentially vulnerable to hardware failures. The file system's tolerance-to-storage-failure(s) is determined as the file system experiences various forms of data degradation as a result of the injected simulated hardware failures. This tolerance-to-storage-failure(s) is then scored and may be thereafter considered, e.g., by storage administrators, as a metric when choosing among file systems.

Figure 3A:
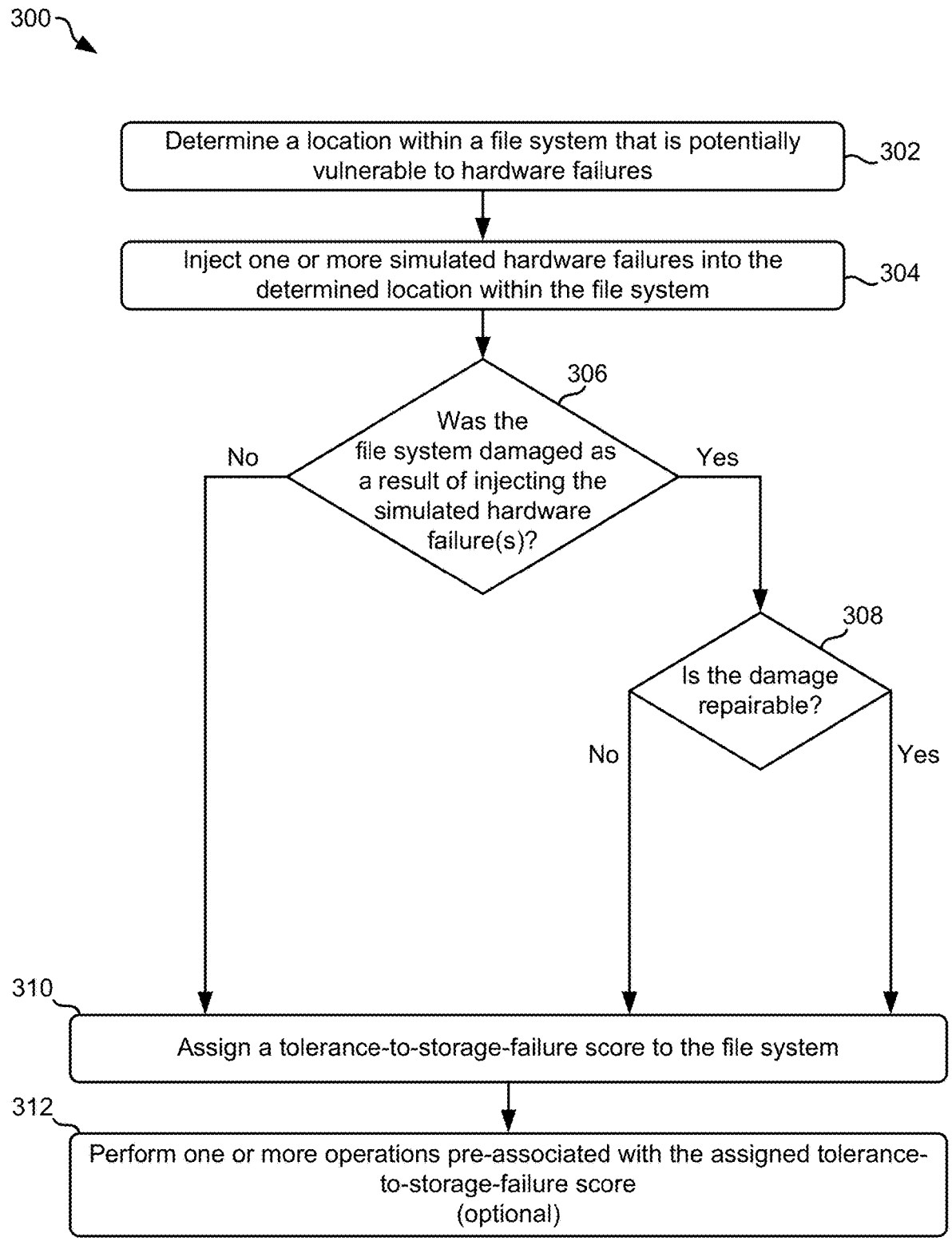
FIG. 3A is a flowchart of a method, in accordance with one embodiment.
Figure 3B:
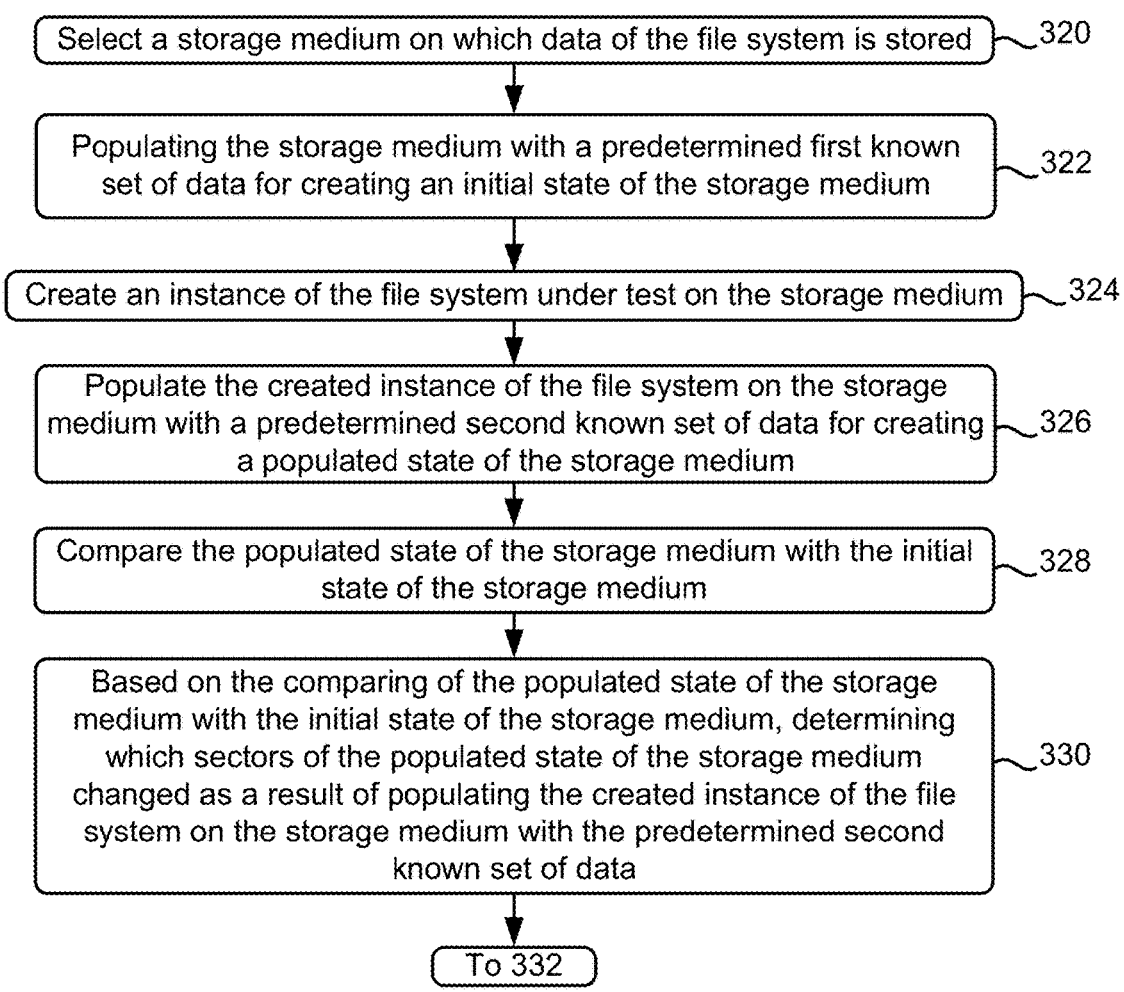
FIG. 3B is a flowchart of sub-processes of an operation of the flowchart of the method of FIG. 3A.
Figure 3B:
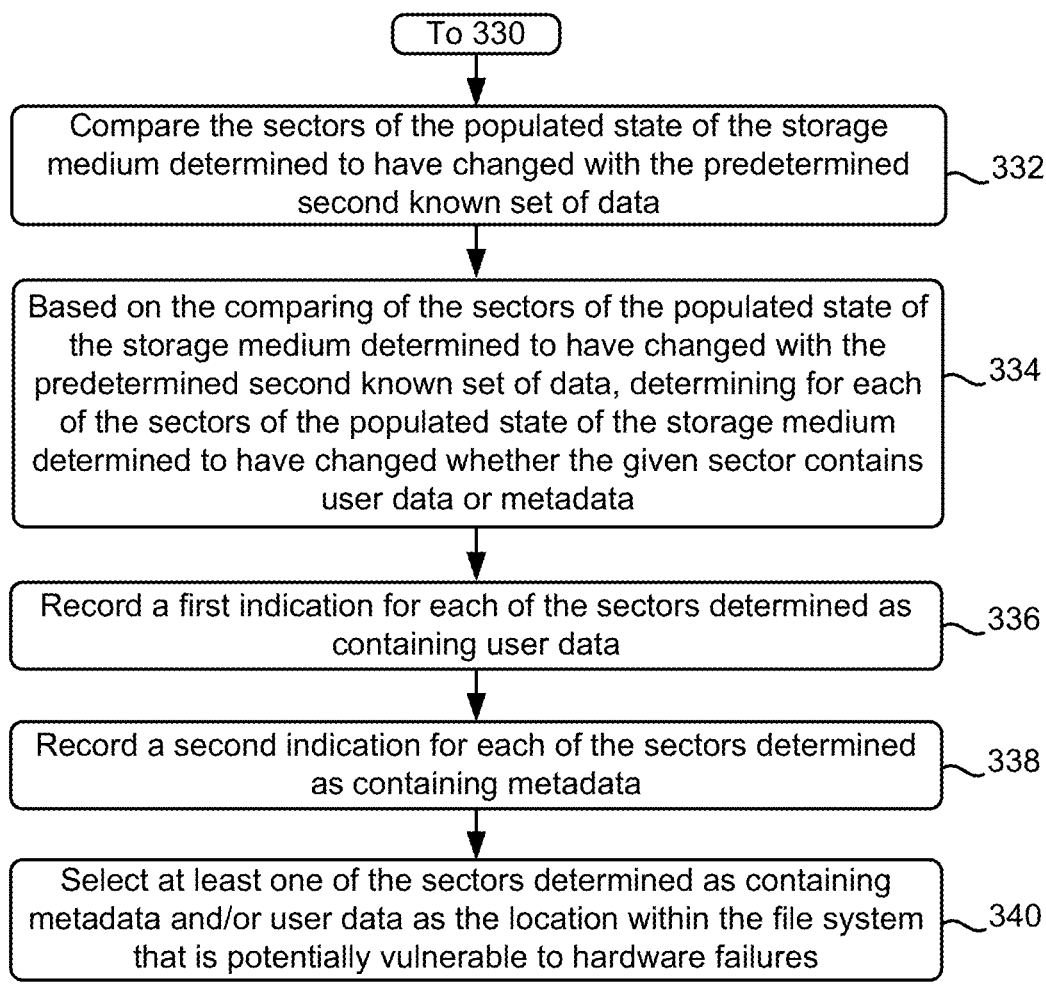
Figure 3C:
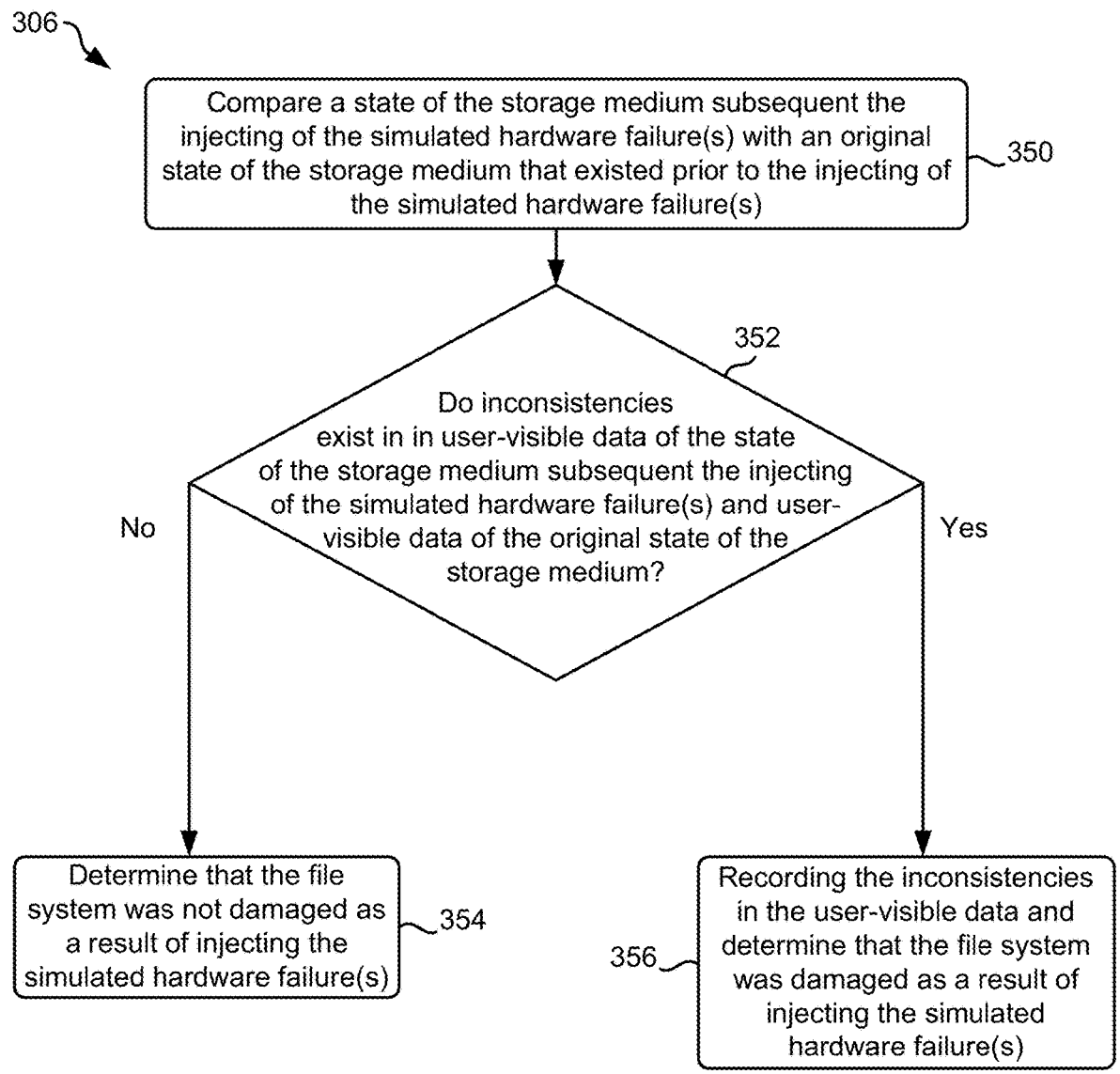
FIG. 3C is a flowchart of sub-processes of an operation of the flowchart of the method of FIG. 3A.

Now referring to FIGS. 3A-3C, flowcharts of a method 300 are shown according to one embodiment. The method 300 may be performed in accordance with the present invention in any of the environments depicted in FIGS. 1-2, among others, in various embodiments. Of course, more or less operations than those specifically described in FIGS. 3A-3C may be included in method 300, as would be understood by one of skill in the art upon reading the present descriptions.

Each of the steps of the method 300 may be performed by any suitable component of the operating environment. For example, in various embodiments, the method 300 may be partially or entirely performed by a computer, or some other device having one or more processors therein. The processor, e.g., processing circuit(s), chip(s), and/or module(s)

implemented in hardware and/or software, and preferably having at least one hardware component may be utilized in any device to perform one or more steps of the method 300. Illustrative processors include, but are not limited to, a central processing unit (CPU), an application specific integrated circuit (ASIC), a field programmable gate array (FPGA), etc., combinations thereof, or any other suitable computing device known in the art.

It should be prefaced that although several of the descriptions below refer to performing various operations of method 300 with respect to a single location within a file system, in some other approaches, method 300 may be performed with respect to a plurality of locations within a single file system. In yet further approaches, method 300 may be performed with respect to a single and/or a plurality of locations within more than one file system. In such approaches, operations of method 300 may be performed at the same time (in parallel) and/or at different times (in series) on the location(s) of one or more files systems.

Operation 302 of method 300 includes determining a location within a file system that is potentially vulnerable to hardware failures. The location within the file system that is potentially vulnerable to hardware failures may be any location within the file system. However, in some approaches, it may be considered that a file system resides on storage media, and storage media has historically grown larger and larger in storage capacity as technology develops. For example, some commodity HDDs and SSD's are currently in the terabyte (TB) range. That being said, although method 300 is highly parallelizable, in some approaches it may be prohibitively time consuming to thoroughly inject simulated hardware failures across TBs of data that are determined to be locations within the file system that are potentially vulnerable to hardware failures. However, this is not a problem, as techniques in this invention describe means by which to reduce the amount of storage space to explore to a tractable quantity. A majority of the storage locations of a file system are not particularly relevant for evaluating the file system's "tolerance-to-storage-failure," as will now be described below.

A file system generally uses on-disk space for two purposes. First, the file system stores user data on the on-disk space. Second, the file system stores various types of metadata on the on-disk space. Some metadata is user-visible, e.g. such as file length, mtime, permissions, extended attributes, etc., while other metadata is only used internally by the file system in order to locate and track user data. Moreover, a file system typically uses a relatively small amount of space for storing metadata, while the majority of the file system is used for storing user data.

From the perspective of corruption, all user data is equivalent. This is because file systems offer the same guarantees, e.g., of resilience, to all user data. As will be described elsewhere herein, because file systems offer the same guarantees to all user data, in some approaches, the determined location of the file system that is potentially vulnerable to hardware failures (and thereafter in which simulated failures are injected) may include only a small subset of the user data, e.g., in order to establish a tolerance-to-storage-failure score for the file system.

However, it should be noted that not all metadata is always created equal, and therefore the location within the file system that is potentially vulnerable to hardware failures may in some approaches include several different instances of metadata. This is because file systems maintain a variety of structures on disk, e.g. a superblock, an inode map, an allocation map, recovery logs, scratch space, etc. The effect of data degradation on each of these structures is wide-ranging. For example, the effect of data degradation occurring on one or more structures may be potentially catastrophic, e.g., superblock corruption. This may be because, in a more specific example, superblock corruption generally prevents a user from having any interaction with the file system. In another more specific example, inode map corruption can cause the file system to believe files no longer exist, or can cause some files to silently lose data. The effect of data degradation occurring on one or more structures may in some other examples be considered not as serious, e.g., flipping an unused block to a used block in the allocation map, which "eats" a block, i.e., consumes a block of storage, so that user data cannot subsequently be placed there. Such a degradation may not be viewed as problematic except in rare situations wherein the entire storage device is filled with data from the file system and the loss of that block prevents additional storage. In this case, however, the loss of the block is merely incrementally troubling. Moreover, the effect of data degradation occurring on one or more structures, according to another example, may be considered harmless, e.g., modifying unused regions of a sector (a minimum addressable unit of a storage media), or sectors used for scratch space. As will become apparent to one of ordinary skill in the art upon reading descriptions herein, whether or not a file system checker effectively tests each of these structures is one question that several of the embodiments and/or approaches described herein clarify.

With continued reference to operation 302 of method 300, in some approaches, determining the location within the file system that is potentially vulnerable to hardware failures includes dividing data stored on a given storage medium for distinguishing user data from metadata, e.g., see FIG. 3B.

Referring momentarily to FIG. 3B, exemplary sub-operations of method 300 are illustrated in accordance with one embodiment, one or more of which may be used to perform operation 302 of FIG. 3A. However, it should be noted that the sub-operations of FIG. 3B are illustrated in accordance with one embodiment which is in no way intended to limit the invention.

Sub-operation 320 includes selecting at least one storage medium, e.g., a disk, a cloud based storage medium, a nonvolatile memory (NVM) based storage medium, etc., on which data of the file system is stored. It should be noted that in some approaches in which data of the file system is stored on more than one storage medium, more than one storage medium may be selected. For simplified contextual purposes, which is in no way intended to limit the descriptions herein, several of the following descriptions refer to data of the file system being stored on one storage medium. However, in some other approaches, descriptions, e.g., operations such as selecting of sub-operation 320, populating of sub-operation 322, etc., that refer to the one storage medium may be additionally and/or alternatively refer to more than one storage medium on which data of the file system may be stored.

In some approaches, the selected storage medium may include a file masquerading as a disk. According to a more specific approach, such a file may be stored on a RAM disk. Utilizing a file stored on a RAM disk for operation 302 may result in a maintaining of and/or an increase in performance rates of the system that contains the storage medium, e.g., due to the ease of access to the file.

According to some approaches in which data of the file system is stored on more than one storage medium, e.g. for the case of a distributed file system, the storage medium selected in sub-operation 320 may be selected according to any one or more factors, e.g., a most frequently utilized storage medium in a predetermined duration of time, randomly such as using a known type of random selection generator, a most recently utilized storage medium, etc.

The selected storage medium may be populated with a predetermined first known set of data for creating an initial state of the storage medium, e.g., see sub-operation 322. In some preferred approaches, the predetermined first known set of data is written by a (simulated) hardware flash, pre-setting the disk to a known state. For example, in one approach, populating the storage medium with a predetermined first known set of data includes writing a repeating first unique integer, e.g., 000 . . . , 111 . . . , 222 . . . , 333 . . . , etc., to the storage medium. A repeating first unique integer may be used as it is unlikely that the same first unique integer will be randomly produced in the state of the file system that exists subsequent injecting the simulated hardware failure(s).

In some approaches a dd command may be used for populating the storage medium with the predetermined first known set of data. The dd command may be a utility of UNIX, and can be used for direct input/output with hardware devices. For example, the command dd if=/dev/zero of=/dev/sda2 (input file/dev/zero, output file/dev/sda2) will write over the hardware device at/dev/sda2 (typically a hard drive) with all zeroes collected from the zero device/dev/zeros.

Sub-operation 324 of FIG. 3B includes creating an instance of the file system under test on the storage medium. The instance of the file system under test on the storage medium may be created using known techniques.

In one approach, the created instance of the file system is populated on the storage medium with a predetermined second known set of data for creating a populated state of the storage medium, e.g., see sub-operation 326. The predetermined second known set of data may include any known set of data, and in some approaches may depend on the support offered by the file system. The predetermined second known set of data is preferably written by a simulated real user workload interacting with the file system instead of by the storage device directly, e.g., thus triggering file system updates to both metadata and user data. According to a more specific example, the predetermined second known set of data used for creating the populated state of the storage medium may include a set of directories and some files with an access control list (ACL). In another example, the predetermined second known set of data used for creating the populated state of the storage medium may include an extended attribute. In yet another example, the predetermined second known set of data used for creating the populated state of the storage medium may include one or more predetermined amounts, e.g., one kilobyte (KB), eight KBs, one GB, etc. of a unique integer, e.g., 111 . . . , 222 . . . , 333 . . . , etc. Note that in some approaches the predetermined second known set of data is different from the predetermined first known set of data.

With the populated state of the storage medium created, the populated state of the storage medium may be compared with the initial state of the storage medium, e.g., see sub-operation 328. In one approach, the comparing may include performing a sector-by-sector comparison of the populated state of the storage medium against the initial state of the storage medium. The sector-by-sector comparison of the states of the storage medium may be performed using known comparison techniques. In one approach, based on the sector-by-sector comparison of the states of the storage medium, sector(s) that exist in different states in the populated state of the storage medium and the initial state of the storage medium may be determined. In some approaches, sector(s) that are determined to exist in different states in the populated state of the storage medium and the initial state of the storage medium are recorded. Note that sectors typically include either data or metadata, but typically not both.

Based on the comparing of the populated state of the storage medium with the initial state of the storage medium, it may be determined which sectors of the populated state of the storage medium have changed as a result of populating the created instance of the file system on the storage medium with the predetermined second known set of data, e.g. see sub-operation 330. A known comparison technique may be used for determining which of the sectors of the populated state of the storage medium have changed as a result of populating the created instance of the file system on the storage medium with the predetermined second known set of data. Sectors of the populated state of the storage medium that are determined from the comparing to have changed may be recorded, e.g., temporarily recorded, recorded in a table, recorded in a list, etc.

Sectors of the populated state of the storage medium that have changed as a result of populating the created instance of the file system on the storage medium will in the descriptions hereafter be referred to as "changed sectors" for simplification purposes.

It should be noted that for sectors of the populated state of the storage medium that have not changed, there may exist a substantial improbability that the state of such sectors are in fact a result of the sectors having been overwritten by the file system with the exact initial contents of the sectors. Moreover, the relatively small probability that such an exact overwrite might occur may be even further decreased as a result of using a randomly generated set of data for the predetermined first known set of data, as opposed to using a repeating unique integer, e.g., 111 . . . , 222 . . . , 333 . . . , etc. This is because in some approaches, a file system may already mark unused regions of structures with a repeating pattern, e.g., a set of repeating zeros, 010-101 . . . , etc., for otherwise easily distinguishing such regions.

The changed sectors of the populated state of the storage medium may be compared with the predetermined second known set of data, e.g., see sub-operation 332. The comparison may be performed using known comparison techniques.

Based on the comparing of the changed sectors with the predetermined second known set of data, it may be determining for each changed sector whether the given changed sector contains user data or metadata, e.g., see sub-operation 334. In one approach, known techniques may be used for determining which of the changed sectors contain user data. It is assumed that the file system does not transform user data so that such a comparison is possible. If, for example, the file system offers an encryption or compression feature, such features is preferably disabled. Such features are orthogonal to the tolerance-to-storage-failure metric described herein. Changed sectors that are determined to not include user data may be determined, e.g., by default, to include metadata. The findings of such determinations may be recorded, e.g., see sub-operations 336-338.

According to some approaches, recording the findings of whether or not a given changed sector includes user data or metadata may include recording an indication, e.g., a flag, a message, a pointer, etc. In one approach, a first indication may be recorded for each of the sectors determined as containing user data, e.g., see sub-operation 336. In such an approach, each of the first indications may indicate that the respective sector contains user data. In another approach, a second indication may additionally and/or alternatively be recorded for each of the sectors determined as containing metadata, e.g., see sub-operation 338. In such an approach, each of the second indications may indicate that the respective sector contains metadata. Such indication(s) may be stored within the file system, and may be used at any time.

According to various approaches, any of the changed sectors may be selected as the location within the file system that is potentially vulnerable to hardware failures. However, in some approaches it may be considered that metadata-containing sectors may be of particular interest as locations within the file system that are potentially vulnerable to hardware failures because it is likely that the presence of data degradation in different metadata sectors will affect the file system in different ways. In contrast, data sectors are typically isomorphic, although it is conceivable (but not the norm) that this assumption is invalid, e.g. the file system may contain different classes of user data stored in different ways on disk. Accordingly, in some approaches, at least one of the sectors determined as containing metadata and/or user data may be selected as the location within the file system that is potentially vulnerable to hardware failures, e.g., see sub-operation 340.

Injecting simulated hardware failures into sectors containing metadata may be preferred as doing so does not interfere with access to data of the file system. However, in some approaches, at least one of the sectors determined as containing user data may be additionally and/or alternatively selected as the location within the file system that is potentially vulnerable to hardware failures. Injecting simulated hardware failures into sectors containing metadata and user data may in some approaches also be preferred, e.g., in order to determine as a whole how the file system responds to the injected simulated hardware failures.

Selection of at least one of the changed sectors as the location within the file system that is potentially vulnerable to hardware failures may be performed using any type of selection technique. For example, in some approaches, selection of at least one of the sectors as the location within the file system that is potentially vulnerable to hardware failures may be performed, e.g., using a known type of random selection generator, in accordance with a most frequently accessed sector, in accordance with a most recently accessed sector, etc. In another approach, selection of at least one of the sectors as the location within the file system that is potentially vulnerable to hardware failures may include selecting all of the changed sectors.

Referring again to FIG. 3A, with a location within the file system that is potentially vulnerable to hardware failures determined, one or more simulated hardware failures may be injected into the determined location within the file system, e.g., see operation 304 of method 300. Any of the one or more simulated hardware failures may be any known type of hardware failures. For example, in one preferred approach, at least one of the injected simulated hardware failure(s) is data degradation, e.g., a simulation of data degradation using the dd tool referenced elsewhere herein.

In some preferred approaches, injecting one or more simulated hardware failures into the determined location within the file system includes modifying, e.g., flipping, one or more bits of at least one sector. For example, a sector containing a configuration of bits "101" may be modified to be "111." In some preferred approaches, modification of individual bits may be performed using the dd command. In some approaches, simulated hardware failures may be injected systematically. For example, assume that a number of sectors "S" of the file system are determined to be locations within the file system that are potentially vulnerable to hardware failures. Also assume that each of the S sectors include a number of bits "B." Accordingly, there may be $2^{\{S*B\}}$ possible sets of bits to modify, e.g., flip, in order to inject simulated hardware failures. However, it should be considered that while each set of bits to flip can be tested in parallel, the associated exponential cost may be prohibitive. This cost may be reduced in some approaches by, e.g. flipping all runs of 4 bits, flipping only one randomly chosen bit per sector, performing N iterations of the test and randomly choosing the set of bits to flip in each iteration, etc.

With continued reference to method 300, in one approach, injecting one or more simulated hardware failures into the determined location within the file system may include modifying at least one bit of at least one sector determined to contain user data. In another approach, injecting one or more simulated hardware failures into the determined location within the file system may include modifying at least one bit of at least one sector determined to contain metadata. In another approach, injecting one or more simulated hardware failures into the determined location within the file system may include modifying at least one bit of at least one sector determined to contain user data and modifying at least one bit of at least one sector determined to contain metadata. In another approach, injecting one or more simulated hardware failures into the determined location within the file system may include modifying at least one bit of at least one sector determined to contain user data and metadata.

Depending on the approach, the one or more simulated hardware failures may be injected into the determined location within the file system at any time. For example, in some approaches, at least one of the simulated hardware failure(s) may be injected while the file system is mounted. According to a more specific approach, the file system may be mounted and actively being used during injection of the simulated hardware failure(s). For example, in one approach, the active file system may be in the process of, e.g., scanning, changing, making additions to, etc., files or a directory tree. In another approach, at least one of the simulated hardware failure(s) may be injected into the determined location within the file system while the file system is unmounted.

Decision 306 of method 300 includes determining whether the file system was damaged as a result of injecting the simulated hardware failure(s). In some approaches, where more than one hardware failure is injected, the determining of decision 306 preferably includes determining for each of the injected simulated hardware failures, whether the file system was damaged as a result. A preferred approach for determining whether the file system was damaged as a result of injecting the simulated hardware failure(s) is described below, e.g., see FIG. 3C. For context, it may be prefaced that the determination of whether the file system was damaged as a result of injecting the simulated hardware failure(s) may be used (at least in part in some approaches) for determining a tolerance-to-storage-failure score to the file system, e.g., as will be described in operation 310.

Looking to FIG. 3C, exemplary sub-operations of method 300 are illustrated in accordance with one embodiment, one or more of which may be used in determining decision 306 of FIG. 3A. However, it should be noted that the sub-operations of FIG. 3C are illustrated in accordance with one embodiment which is in no way intended to limit the invention.

Sub-operation 350 of FIG. 3C includes comparing a state of the storage medium subsequent the injecting of the simulated hardware failure(s) with an original state of the storage medium that existed prior to the injecting of the simulated hardware failure(s). Such a comparison may be performed using any known technique for comparing states of a file system. In one approach, the comparison may be performed using known techniques, e.g., such as interacting with file systems via known POSIX commands. In another approach, performing the comparison may additionally and/or alternatively include performing a sector-by-sector comparison of the state of the storage medium subsequent to the injecting of the simulated hardware failure(s) with the original state of the storage medium that existed prior to the injecting of the simulated hardware failure(s). A sector-by-sector comparison may be useful for identifying latent bugs that may arise upon additional, difficult to determine, interactions with the file system. Accordingly, method 300 preferably includes storing a copy, e.g., a snapshot, of the original state of the storage medium that existed prior to the injecting of the simulated hardware failure(s), to use for comparing with the state of the storage medium subsequent the injecting of the simulated hardware failure(s).

Based on the comparing of the state of the storage medium subsequent the injecting of the simulated hardware failure(s) with the original state of the storage medium, it may be determined whether inconsistencies exist in user-visible data of the state of the storage medium subsequent the injecting of the simulated hardware failure(s) and user-visible data of the original state of the storage medium, e.g., see sub-operation 352. According to various approaches, user-visible data may include any type of data that may be added and queried in the file system, e.g., such as the actual data, file contents, user-visible metadata such as mtime (metadata that indicates a time at which a file was most recently modified) or file length, metadata that indicates a size of a file, metadata that indicates a number of times that a file was updated in a predetermined duration of time, accented attributes of a file, etc.

In response to determining that inconsistencies exist in user-visible data of the state of the storage medium subsequent the injecting of the simulated hardware failure(s) and user-visible data of the original state of the storage medium, the inconsistencies in the user-visible data may be recorded, e.g., see sub-operation 356. Data collected in recording determined inconsistencies may vary from file system to file system, e.g., some file systems (FSes) may not support extended attributes. Moreover, in one approach, in response to a determination that inconsistencies exist in user-visible data, it may be determined that the file system was damaged as a result of injecting the simulated hardware failure(s).

In contrast, in response to a determination that inconsistencies do not exist in user-visible data of the state of the storage medium subsequent the injecting of the simulated hardware failure(s) and user-visible data of the original state of the storage medium, it may be determined that the file system was not damaged as a result of injecting the simulated hardware failure(s), e.g., see sub-operation 354.

With reference again to FIG. 3A, in some preferred approaches, determining whether the file system was damaged as a result of injecting the simulated hardware failure(s) may include considering whether or not one or more of the simulated hardware failure(s) were injected while the file system was mounted. This is because some instances of latent corruption may manifest upon an unmount and remount being performed, e.g., due to data degradation in a file system recovery log. Accordingly, in one approach, in response to at least one hardware failure being injected while the file system is mounted, the determining of whether inconsistencies exist in user-visible data of the state of the storage medium subsequent the injecting of the simulated hardware failure(s) and user-visible data of the original state of the storage medium may be performed prior to an unmounting of the file system. Moreover, in such an approach, the determination of whether inconsistencies exist in user-visible data of the state of the storage medium subsequent the injecting of the simulated hardware failure(s) and user-visible data of the original state of the storage medium is preferably additionally performed subsequent an unmounting and a remounting of the file system.

Alternatively, where all simulated hardware failures are injected while the file system is unmounted, determining whether the file system was damaged as a result of injecting the simulated hardware failure(s) may be performed at any time.

In response to determining that the injection of the simulated hardware failure(s) resulted in damage to the file system, it may be determined whether the damage is repairable, e.g., see decision 308. In some approaches, one or more known type of file system checker(s), e.g., fsck, associated with the file system may be used for determining whether the damage is repairable. In some approaches, the file system may be unmounted prior to and/or during use of the file system checker(s).

In some approaches, the possible results of any given hardware failure injection event may be categorized into one or more dimensions as will now be described below. Such dimensions may be used for determining whether damage of the file system is repairable, which may be used for assigning a tolerance-to-storage-failure score to the file system (described elsewhere herein in operation 310).

In some approaches, one dimension that may be considered for determining whether the damage is repairable occurs prior to running a file system checker. In one approach, in such a dimension, determining whether damage of the file system is repairable may include determining, e.g., by a controller of a system that includes the file system, an administrator, etc., whether the file system is useable or unusable. For example, according to a more specific approach, a file system that is damaged as a result of injecting hardware failure(s) in the file system and therefore cannot be mounted may be considered unusable while a file system that can be mounted despite being damaged as a result of injecting hardware failure(s) in the file system may be considered usable. In another approach, in such a dimension, determining whether damage of the file system is repairable may include determining whether inconsistencies exist in user-visible data of the state of the storage medium subsequent the injecting of the simulated hardware failure(s) and user-visible data of the original state of the storage medium. An outcome of this determination may be stored and compared with the user-visible data subsequent the running a file system checker, as will be described elsewhere below. The results of such a comparison may contribute, at least in part to the file system's assigned tolerance-to-storage-failures, e.g., see operation 310.

According to some other approaches, another dimension that may be additionally and/or alternatively considered for determining whether the damage is repairable occurs during running of the file system checker. In one approach, in such a dimension, determining whether damage of the file system is repairable may include determining, e.g., by the running file system checker, whether or not a known type of problem, e.g., failure to mount, lost data, inconsistencies exist in user-visible data, etc., is detected in the file system. In such an approach, the damage may be determined to not be repairable in response to the file system checker being unable to detect the problem during running of the file system checker. In response to the running file system checker detecting a problem, another dimension that may be considered in determining whether damage of the file system is repairable may include whether or not the running file system checker claims that the file system checker is able to fix the problem or not. In response to the running file system checker claiming to be able to fix the problem, another dimension that may be considered in determining whether damage of the file system is repairable may include whether or not the running file system checker is actually able to fix the problem, e.g., successful in repairing the damage. In such approaches, an ability of the file system checker to detect problems and/or an ability of the file system checker to claim to and thereafter successfully fix problems contributes to the file system's tolerance-to-storage-failures, as will be described elsewhere below, e.g., see operation 310.

According to some other approaches, another dimension that may be additionally and/or alternatively considered for determining whether the damage is repairable occurs after running the file system checker. In one approach, in such a dimension, determining whether damage of the file system is repairable may include determining, e.g., by the file system checker, whether or not the file system is useable or unusable. Moreover, in another approach, determining whether damage of the file system is repairable may additionally and/or alternatively include determining, e.g., by the file system checker, whether or not user-visible data that was previously changed as a result of injecting the simulated hardware failure(s) has been returned to an original condition of the data. In such approaches, an ability of the file system checker to return an unusable state of the file system to a useable state and/or an ability of the file system checker to return user-visible data to an original condition of the data, contributes to the file system's tolerance-to-storage-failures, as will be described elsewhere below, e.g., see operation 310.

Several non-limiting examples of determining, using a file system checker, whether or not the file system is repairable in the context of the above described dimensions will now be discussed below. It should be prefaced that, in some approaches, where multiple file system checkers are used, the original data degraded state may be restored between each iteration of running a file system checker in order to accurately compare relative effectiveness of each file system checker.

According to one example, before running a file system checker, the file system may be determined to be unusable. During running of the file system checker, the file system checker may detect a problem causing the file system to be unusable, and moreover the file system may claim to fix the problem. After running the file system checker, the user-visible data may be inconsistent from the original state of the user-visible data, e.g., the state of the user-visible data prior to injecting simulated hardware failures in the file system. This may indicate a successful implementation of a file system checker, and accordingly in one approach it may be determined that the damage is repairable.

According to another example, before running a file system checker, the file system may be determined to be usable; however it may be determined that user-visible data of the of the file system is inconsistent from the original state of the user-visible data. Subsequently, during running of the file system checker, the file system checker may not detect the problem (the inconsistent user-visible data). After running the file system checker, the user-visible data may remain inconsistent from the original state of the user-visible data. This may indicate a failed implementation of a file system checker and accordingly in one approach it may be determined that the damage is not repairable.

According to another example, before running a file system checker, the file system may be determined to be usable, however it may be determined that user-visible data of the of the file system is inconsistent from the original state of the user-visible data. Subsequently, during running of the file system checker, the file system checker may detect the problem (the inconsistent user-visible data), but claim to not be able to fix the problem. After running the file system checker, the user-visible data may remain inconsistent from the original state of the user-visible data. This may indicate a failed implementation of a file system checker and accordingly in one approach it may be determined that the damage is not repairable.

According to yet another example, before running a file system checker, the file system may be determined to be usable, and it may be determined that the user-visible data of the file system is consistent with the original state of the user-visible data. Subsequently, during running of the file system checker, the file system checker may not detect any problems, e.g., inconsistent user-visible data, inability to mount the file system, lost data, etc. After running the file system checker, the user-visible data may remain consistent with the original state of the user-visible data. In this approach, it may be difficult to make any definite determinations about the condition of the file system. This is because injecting the simulated hardware failure(s) may have changed data of on-disk scratch space, whose contents may be irrelevant to the proper functioning of the file system. If, for example, the changed data of the on-disk scratch space is never used again, the change of the data may be considered neutral. However, such changes may also have corrupted data that isn't currently used, but may be exposed as a corruption in response to the file system thereafter being further modified. If such a situation occurs, this would indicate a failed implementation of the file system checker, e.g., not least because it suggests an absence of checksums for critical data structures, and accordingly in one approach it may be determined that the damage of the file system is not repairable.

To summarize the above dimensions and examples, in general, any time that the file system is unusable and/or user-visible data is inconsistent after a file system checker runs indicates a failure for the file system checker implementation.

Based on whether the file system was damaged as a result of injecting the simulated hardware failure(s) and/or based on whether or not the damage is determined to be repairable, a tolerance-to-storage-failure score may be assigned to the file system, e.g., see the logical paths of decisions 306 and 308 entering operation 310 in FIG. 3A. It should be noted that the larger the sample size of such injected simulated hardware failures and resulting determinations, e.g., see decisions 306 and 308, the more accurate the tolerance-to-storage-failure score assigned to the file system may be. However, this accuracy should be balanced with the previously mentioned costs associated with injecting hardware failure(s) across the $2^{\{S*B\}}$ possible sets of bits of the file system.

According to various approaches, tolerance-to-storage-failure scores may be pre-associated with any potential results of injecting the simulated hardware failure(s), e.g., the file system being damaged or not being damaged as a result of injecting the simulated hardware failure(s), the damage to the file system being repairable, the damage to the file system not being repairable, the outcomes of the dimensions described above, etc. According to some more specific approaches, the assigned tolerance-to-storage-failure scores may be scores of a predefined range, e.g., 0-1, 0-100, 1-10, etc.

The tolerance-to-storage-failure scores may in some approaches be stored, e.g., in a table, that is accessed, e.g., by a controller, by a computer, by one or more file system checkers, in response to determining the results of injecting the simulated hardware failure(s). For example, in response to determining that the file system is damaged as a result of injecting hardware failure(s) therein and in response to determining that the damage is not repairable, a table may be accessed for determining an appropriate tolerance-to-storage-failure score for the file system. To clarify, in such an approach, an "appropriate" tolerance-to-storage-failure score for the file system may be a tolerance-to-storage-failure score that is pre-associated with at least the determined results: 1) the file system is damaged as a result of injecting hardware failure(s) therein, and 2) the damage is determined to be not repairable.

The assigned tolerance-to-storage-failure scores indicate the file system's resistance to hardware failures, e.g., as tested using injected simulated storage failure(s), and moreover the file system's ability to overcome hardware failures. This information may be considered by, e.g., a manufacturer, a user, an administrator of a data storage network, etc., for determining whether to use the file system and/or what file system to use. For example, a user may decide to use a particular file system based on the file systems tolerance-to-storage-failures, e.g., as indicated by a tolerance-to-storage-failure score assigned to the file system. As a result, such a user will not have to learn/determine the file system's tolerance-to-storage-failure during intended user use of the file system, but instead may do so before such use. This is particularly important for previously mentioned use cases such as file systems of embedded systems, e.g., for file systems deployed in challenging physical environments such as the International Space Station (ISS) or deep sea exploration. This is because file systems with a relatively high tolerance-to-storage-failure scores may be used before sending such embedded systems off to remote/inaccessible locations.

In some approaches, the assigned tolerance-to-storage-failure score may be output and/or stored. For example, the assigned tolerance-to-storage-failure score may be output to a database that contains assigned tolerance-to-storage-failure scores of different file systems, stored at a predefined location within the file system, output to a display, etc.

Moreover, in some optional approaches, one or more operations pre-associated with the assigned tolerance-to-storage-failure score may be performed, e.g., see operation 312 of method 300. For example, in some preferred approaches, in response to the assigned tolerance-to-storage-failure score being pre-associated with performing a corrective action on the file system for repairing the damage, the damage may be repaired. In one approach, the damage may be repaired using file system checker(s) associated with the file system.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. The processor may be of any configuration as described herein, such as a discrete processor or a processing circuit that includes many components such as processing hardware, memory, I/O interfaces, etc. By integrated with, what is meant is that the processor has logic embedded therewith as hardware logic, such as an application specific integrated circuit (ASIC), a FPGA, etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A computer-implemented method, comprising:
   determining a location within a file system that is potentially vulnerable to hardware failures;
   injecting one or more simulated hardware failures into the determined location within the file system, wherein at least one of the injected simulated hardware failure(s) is data degradation;
   determining whether the file system was damaged as a result of injecting the simulated hardware failure(s);
   in response to determining that the injection of the simulated hardware failure(s) resulted in damage to the file system, determining whether the damage is repairable; and
   based on whether the file system was damaged as a result of injecting the simulated hardware failure(s) and/or based on whether or not the damage is determined to be repairable, assigning a tolerance-to-storage-failure score to the file system.

2. The computer-implemented method of claim 1, wherein determining the location within the file system that is potentially vulnerable to hardware failures includes:
   selecting a storage medium on which data of the file system is stored, wherein the selected storage medium includes a file masquerading as a Random Access Memory (RAM) disk;
   populating the storage medium with a predetermined first known set of data for creating an initial state of the storage medium;
   creating an instance of the file system under test on the storage medium;
   populating the created instance of the file system on the storage medium with a predetermined second known set of data for creating a populated state of the storage medium, wherein the created instance of the file system on the storage medium is populated using a dd command;
   comparing the populated state of the storage medium with the initial state of the storage medium;
   based on the comparing of the populated state of the storage medium with the initial state of the storage medium, determining which sectors of the populated state of the storage medium changed as a result of populating the created instance of the file system on the storage medium with the predetermined second known set of data;

comparing the sectors of the populated state of the storage medium determined to have changed with the predetermined second known set of data;

based on the comparing of the sectors of the populated state of the storage medium determined to have changed with the predetermined second known set of data, determining for each of the sectors of the populated state of the storage medium determined to have changed whether the given sector contains user data or metadata;

recording a first indication for each of the sectors determined as containing user data, wherein each of the first indications indicate that the respective sector contains user data;

recording a second indication for each of the sectors determined as containing metadata, wherein each of the second indicate that the respective sector contains metadata; and selecting at least one of the sectors determined as containing metadata and/or user data as the location within the file system that is potentially vulnerable to hardware failures.

3. The computer-implemented method of claim 2, wherein injecting one or more simulated hardware failures into the determined location within the file system includes: modifying at least one bit of a first sector determined to contain user data and modifying at least one bit of a second sector determined to contain metadata, wherein the first sector does not contain metadata, wherein the second sector does not contain user data.

4. The computer-implemented method of claim 2, wherein determining whether the file system was damaged as a result of injecting the simulated hardware failure(s) includes:

comparing a state of the storage medium subsequent to the injecting of the simulated hardware failure(s) with an original state of the storage medium that existed prior to the injecting of the simulated hardware failure(s);

based on the comparing of the state of the storage medium subsequent to the injecting of the simulated hardware failure(s) with the original state of the storage medium, determining whether inconsistencies exist in user-visible data of the state of the storage medium subsequent to the injecting of the simulated hardware failure(s) and user-visible data of the original state of the storage medium;

in response a determination that inconsistencies exist in user-visible data of the state of the storage medium subsequent to the injecting of the simulated hardware failure(s) and user-visible data of the original state of the storage medium, recording the inconsistencies in the user-visible data and determining that the file system was damaged as a result of injecting the simulated hardware failure(s); and in response to a determination that inconsistencies do not exist in user-visible data of the state of the storage medium subsequent to the injecting of the simulated hardware failure(s) and user-visible data of the original state of the storage medium, determining that the file system was not damaged as a result of injecting the simulated hardware failure(s).

5. The computer-implemented method of claim 4, wherein the user-visible data includes accented attributes of a file.

6. The computer-implemented method of claim 2, wherein at least one of the simulated hardware failure(s) is injected while the file system is mounted and being actively used, wherein determining whether the file system was damaged as a result of injecting the simulated hardware failure(s) includes:

determining, prior to an unmounting of the file system, whether inconsistencies exist in user-visible data of a state of the storage medium subsequent to the injecting of the simulated hardware failure(s) and user-visible data of an original state of the storage medium that existed prior to the injecting of the simulated hardware failure(s); and determining, subsequent to an unmounting and a remounting of the file system, whether inconsistencies exist in user-visible data of the state of the storage medium subsequent to the injecting of the simulated hardware failure(s) and user-visible data of the original state of the storage medium.

7. The computer-implemented method of claim 1, wherein a first of the simulated hardware failure(s) is injected while the file system is mounted, wherein a second of the simulated hardware failure(s) is injected into the determined location within the file system while the file system is unmounted.

8. The computer-implemented method of claim 1, wherein at least one of the simulated hardware failure(s) is injected into the determined location within the file system while the file system is unmounted.

9. The computer-implemented method of claim 1, comprising:

outputting and/or storing the assigned tolerance-to-storage-failure score; and in response to the assigned tolerance-to-storage-failure score being pre-associated with performing a corrective action on the file system for repairing the damage, repairing the damage, wherein the damage is repaired using file system checker(s) associated with the file system.

10. The computer-implemented method of claim 1, wherein determining the location within the file system that is potentially vulnerable to hardware failures includes:

selecting a storage medium on which data of the file system is stored, wherein the selected storage medium includes a file masquerading as a Random Access Memory (RAM) disk;

populating the storage medium with a predetermined first known set of data for creating an initial state of the storage medium, wherein a dd command is used for populating the storage medium, wherein a randomly generated set of data is used for the predetermined first known set of data;

creating an instance of the file system under test on the storage medium;

populating the created instance of the file system on the storage medium with a predetermined second known set of data for creating a populated state of the storage medium;

comparing the populated state of the storage medium with the initial state of the storage medium;

based on the comparing of the populated state of the storage medium with the initial state of the storage medium, determining which sectors of the populated state of the storage medium changed as a result of populating the created instance of the file system on the storage medium with the predetermined second known set of data;

comparing the sectors of the populated state of the storage medium determined to have changed with the predetermined second known set of data;

based on the comparing of the sectors of the populated state of the storage medium determined to have changed with the predetermined second known set of data, determining for each of the sectors of the populated state of the storage medium determined to have changed whether the given sector contains user data or metadata;

recording a first indication for each of the sectors determined as containing user data, wherein each of the first indications indicate that the respective sector contains user data;

recording a second indication for each of the sectors determined as containing metadata, wherein each of the second indications indicate that the respective sector contains metadata; and selecting at least one of the sectors determined as containing metadata as the location within the file system that is potentially vulnerable to hardware failures, wherein injecting one or more simulated hardware failures into the determined location within the file system includes: modifying at least one bit of at least one sector determined to contain metadata, wherein the modifying includes flipping the at least one bit of the at least one sector, wherein the file system maintains a superblock structure on the disk, wherein the file system is a distributed file system stored on a plurality of storage mediums.

11. A computer program product for utilizing hardware failure simulation for assessing a tolerance of a file system to storage failures, the computer program product comprising a computer readable storage medium having program instructions embodied therewith, the program instructions readable and/or executable by a computer to cause the computer to:

determine, by the computer, a location within a file system that is potentially vulnerable to hardware failures, wherein determining the location within the file system that is potentially vulnerable to hardware failures includes selecting a storage medium on which data of the file system is stored, wherein the selected storage medium includes a file masquerading as a disk;

inject, by the computer, one or more simulated hardware failures into the determined location within the file system;

determine, by the computer, whether the file system was damaged as a result of injecting the simulated hardware failure(s);

in response to determining that the injection of the simulated hardware failure(s) resulted in damage to the file system, determining, by the computer, whether the damage is repairable; and based on whether the file system was damaged as a result of injecting the simulated hardware failure(s) and/or based on whether or not the damage is determined to be repairable, assigning, by the computer, a tolerance-to-storage-failure score to the file system.

12. The computer program product of claim 11, wherein determining the location within the file system that is potentially vulnerable to hardware failures includes:

populating the storage medium with a predetermined first known set of data for creating an initial state of the storage medium, wherein a randomly generated set of data is used for the predetermined first known set of data;

creating an instance of the file system under test on the storage medium;

populating the created instance of the file system on the storage medium with a predetermined second known set of data for creating a populated state of the storage medium;

comparing the populated state of the storage medium with the initial state of the storage medium;

based on the comparing of the populated state of the storage medium with the initial state of the storage medium, determining which sectors of the populated state of the storage medium changed as a result of populating the created instance of the file system on the storage medium with the predetermined second known set of data;

comparing the sectors of the populated state of the storage medium determined to have changed with the predetermined second known set of data;

based on the comparing of the sectors of the populated state of the storage medium determined to have changed with the predetermined second known set of data, determining for each of the sectors of the populated state of the storage medium determined to have changed whether the given sector contains user data or metadata;

recording a first indication for each of the sectors determined as containing user data, wherein each of the first indications indicate that the respective sector contains user data;

recording a second indication for each of the sectors determined as containing metadata, wherein each of the second indications indicate that the respective sector contains metadata; and selecting at least one of the sectors determined as containing metadata and/or user data as the location within the file system that is potentially vulnerable to hardware failures.

13. The computer program product of claim 12, wherein injecting one or more simulated hardware failures into the determined location within the file system includes modifying at least one bit of at least one sector determined to contain user data and modifying at least one bit of at least one sector determined to contain metadata.

14. The computer program product of claim 12, wherein determining whether the file system was damaged as a result of injecting the simulated hardware failure(s) includes:

comparing a state of the storage medium subsequent to the injecting of the simulated hardware failure(s) with an original state of the storage medium that existed prior to the injecting of the simulated hardware failure(s);

based on the comparing of the state of the storage medium subsequent to the injecting of the simulated hardware failure(s) with the original state of the storage medium, determining whether inconsistencies exist in user-visible data of the state of the storage medium subsequent to the injecting of the simulated hardware failure(s) and user-visible data of the original state of the storage medium;

in response a determination that inconsistencies exist in user-visible data of the state of the storage medium subsequent to the injecting of the simulated hardware failure(s) and user-visible data of the original state of the storage medium, recording the inconsistencies in the user-visible data and determining that the file system was damaged as a result of injecting the simulated hardware failure(s); and in response to a determination that inconsistencies do not exist in user-visible data of the state of the storage medium subsequent to the injecting of the simulated hardware failure(s) and user-visible data of the original state of the storage medium, determining that the file system was not damaged as a result of injecting the simulated hardware failure(s)

wherein encryption features and compression features of the file system are disabled during the comparing the populated state of the storage medium with the initial state of the storage medium.

15. The computer program product of claim 14, wherein the user-visible data includes file contents of the file masquerading as the disk.

16. The computer program product of claim 12, wherein at least one of the simulated hardware failure(s) is injected while the file system is mounted, wherein determining whether the file system was damaged as a result of injecting the simulated hardware failure(s) includes:

determining, prior to an unmounting of the file system, whether inconsistencies exist in user-visible data of a state of the storage medium subsequent to the injecting of the simulated hardware failure(s) and user-visible data of an original state of the storage medium that existed prior to the injecting of the simulated hardware failure(s); and determining, subsequent to an unmounting and a remounting of the file system, whether inconsistencies exist in user-visible data of the state of the storage medium subsequent to the injecting of the simulated hardware failure(s) and user-visible data of the original state of the storage medium.

17. The computer program product of claim 11, wherein at least one of the simulated hardware failure(s) is injected while the file system is mounted and being actively used.

18. The computer program product of claim 11, wherein at least one of the simulated hardware failure(s) is injected into the determined location within the file system while the file system is unmounted.

19. The computer program product of claim 11, the program instructions readable and/or executable by the computer to cause the computer to:

output and/or store, by the computer, the assigned tolerance-to-storage-failure score; and in response to the assigned tolerance-to-storage-failure score being pre-associated with performing a corrective action on the file system for repairing the damage, repairing, by the computer, the damage, wherein the damage is repaired using file system checker(s) associated with the file system.

20. A system, comprising:

a processor; and logic integrated with the processor, executable by the processor, or integrated with and executable by the processor, the logic being configured to:

determine, from a plurality of storage mediums, a most frequently accessed storage medium;

determine a location within a file system stored on the determined storage medium, that is potentially vulnerable to hardware failures;

inject one or more simulated hardware failures into the determined location within the file system;

determine whether the file system was damaged as a result of injecting the simulated hardware failure(s);

in response to determining that the injection of the simulated hardware failure(s) resulted in damage to the file system, determine whether the damage is repairable; and based on whether the file system was damaged as a result of injecting the simulated hardware failure(s) and/or based on whether or not the damage is determined to be repairable, assign a tolerance-to-storage-failure score to the file system.

* * * * *